(12) United States Patent
Hedberg

(10) Patent No.: US 6,236,242 B1
(45) Date of Patent: May 22, 2001

(54) LINE RECEIVER CIRCUIT WITH LARGE COMMON MODE RANGE FOR DIFFERENTIAL INPUT SIGNALS

(75) Inventor: Mats Hedberg, Haninge (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/512,330

(22) Filed: Feb. 24, 2000

Related U.S. Application Data

(63) Continuation of application No. PCT/EP98/05366, filed on Aug. 24, 1998.

(30) Foreign Application Priority Data

Aug. 25, 1997 (DE) .............................. 197 36 900

(51) Int. Cl.[7] .................................................. H03K 5/22
(52) U.S. Cl. .............................. 327/65; 327/66; 327/108; 327/563
(58) Field of Search ................... 327/52–53, 65, 327/66, 359, 50, 63, 355, 563, 108–112

(56) References Cited

U.S. PATENT DOCUMENTS

| | | | |
|---|---|---|---|
| 4,766,394 | * | 8/1988 | Yukawa ................... 330/253 |
| 4,907,121 | * | 3/1990 | Hrassky ................... 327/74 |
| 4,982,119 | * | 1/1991 | Tateishi ................... 327/65 |
| 5,047,663 | | 9/1991 | Lee et al. . |
| 5,309,036 | | 5/1994 | Yang et al. . |
| 5,331,233 | * | 7/1994 | Urakawa ................... 327/52 |
| 5,469,392 | * | 11/1995 | Ihara ................... 327/66 |
| 5,563,835 | * | 10/1996 | Oldham ................... 327/52 |
| 5,568,082 | * | 10/1996 | Hedberg ................... 327/391 |
| 5,606,281 | * | 2/1997 | Gloaguen ................... 327/108 |
| 5,610,557 | | 3/1997 | Jett, Jr. . |
| 5,701,331 | * | 12/1997 | Hunt ................... 327/333 |
| 5,850,159 | * | 12/1998 | Chow et al. ................... 327/170 |
| 6,014,227 | * | 8/2000 | Durec et al. ................... 327/359 |
| 6,104,226 | * | 8/2000 | Weber ................... 327/359 |

FOREIGN PATENT DOCUMENTS

| | | |
|---|---|---|
| 0 382 302 | 8/1990 | (EP) . |
| 0 723 352 | 7/1996 | (EP) . |
| 97/17763 | 5/1997 | (WO) . |

* cited by examiner

*Primary Examiner*—Terry D. Cunningham
*Assistant Examiner*—Long Nguyen
(74) *Attorney, Agent, or Firm*—Nixon & Vanderhye P.C.

(57) ABSTRACT

A line receiver circuit for receiving differential digital signals from a symmetrical transmission line comprises a first differential input stage (1) adapted to receive and process differential signals having a common mode voltage within a first common mode voltage range, and a second differential input stage (2) adapted to receive and process differential signals having a common mode voltage within a second common mode voltage range. Means (N5, N6) detect an operating condition of said first input stage (1) which operating condition depends on a common mode input voltage at said inputs of said first input stage. Means (P1, N7, N8) are provided for enabling said second input stage depending on said detected operating condition of said first input stage.

12 Claims, 1 Drawing Sheet

LINE RECEIVER CIRCUIT WITH LARGE COMMON MODE RANGE FOR DIFFERENTIAL INPUT SIGNALS This application is a continuation of PCT/EP98/05366 filed Aug. 24, 1998.

BACKGROUND OF THE INVENTION

The present invention relates to a line receiver circuit for receiving differential signals from a symmetrical transmission line. A line receiver circuit of this kind is known from WO 95 17763.

A line receiver circuit serves to receive signals from a transmission line. Differential signal transmission over a symmetrical transmission line means that the signals to be received at an input of the line receiver do not necessarily use a well defined potential of the line receiver circuit, e.g. its ground potential, as a reference but use a potential of a second line receiver input as a reference.

The common mode voltage on the transmission line, as seen by the line receiver, can not always be confined to a well defined voltage or limited voltage interval. This has numerous reasons. For instance, different system components interconnected by a symmetrical transmission line, can have an offset in their respective ground reference potentials. Another reason can be, that the line receiver circuit must fulfill the design objective to cooperate with a number of different signal transmission standards each providing a different common mode voltage level.

In reality, however, a line receiver circuit will not be able to operate with common mode voltages over an arbitrary large range. If the common mode voltage on the transmission line exceeds the limits of the common mode voltage range of the line receiver, the reception of signals from the transmission line will become unreliable or impossible. Therefore it is desirable to provide a line receiver circuit with a common mode input voltage range as large as possible.

In order to achieve this, from WO 95 17763 it is known to provide two input stages in parallel, which are designed to operate within different, partially overlapping common mode voltage ranges. If the common mode voltage at the input of that circuit reaches a predetermined level where the second input circuit can operate, the first input circuit is disabled in order to avoid that both input stages simultaneously drive a subsequent stage, because this might result in an undesirable dependency of the overall signal delay on the input common mode voltage level. The circuit according to this document achieves a takeover between said first and said second stage in a lower region of the overall common mode voltage operating range.

It is the object of the present invention, to provide a line receiver circuit with a large common mode operating range such that a take over between said first stage and said second stage takes place in a higher region of the overall common mode operating range.

SUMMARY OF THE INVENTION

According to the present invention, this object is solved as defined in claim 1. Advantageous embodiments of the invention are given in the dependent claims.

A line receiver circuit in accordance with the present invention achieves a large common mode voltage operating range by means of providing more than one input stages each interfacing with the transmission line. Each input stage is adapted to operate within a common mode voltage range specific to the particular stage. The input stages are provided such that their common mode voltage operating ranges partially overlap each other, such that an increased common mode operating range is obtained. The signals output by each input stage are suitably combined. The activation of the second stage is performed by detecting an actual operating condition of the first stage which depends on the input common mode level. The second stage is activated only if the detected operating condition of said first stage indicates that the common mode voltage level approaches a limit of the common mode operating range of said first stage.

Preferably, said first stage is adapted to operate in a lower common mode operating region, and the second stage is adapted to operate in a higher common mode operating region.

According to a preferred embodiment, the line receiver circuit includes a first input stage comprising a floating current mirror for a lower common mode voltage range, and a second input stage comprising a voltage difference amplifier for an upper common mode voltage range. The outputs of the first input stage and the second input stage are connected to operate on the same load elements to obtain a combined output signal.

Preferably, said means for activating and disabling, respectively, said second input stage can gradually enable the second input stage as soon as the common mode input voltage reaches to or beyond the limits of the common mode voltage range of the first input stage, and otherwise keeps the second input stage disabled.

In the following, preferred embodiments of the present invention will be described with reference to the accompanying drawings.

DETAILED DESCRIPTION OF CERTAIN EMBODIMENTS OF THIS INVENTION

Figure 1:
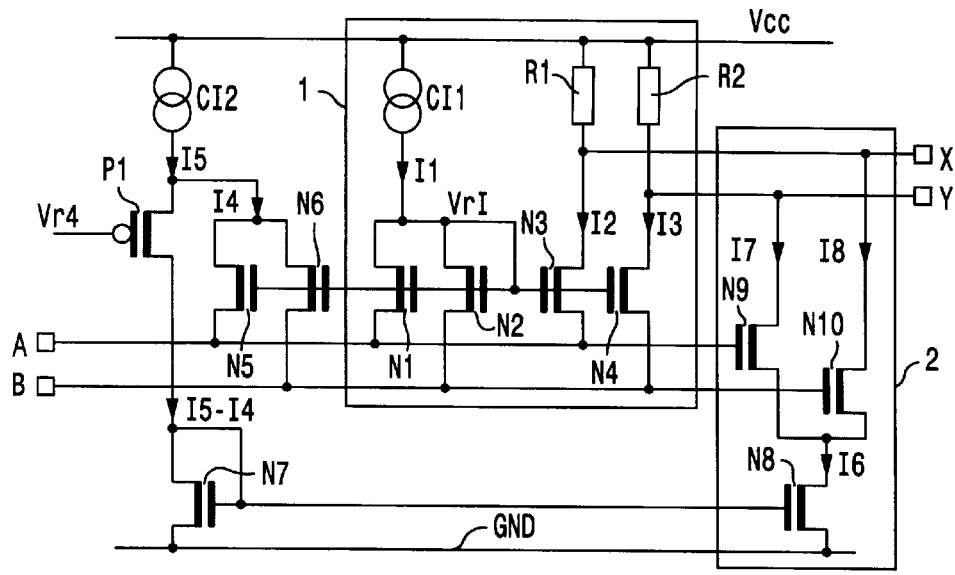
FIG. 1 shows a first embodiment of a line receiver circuit according to the present invention.

In FIG. 1, reference numeral 1 denotes a first input stage of the line receiver circuit, and 2 denotes a second input stage of the line receiver circuit. Vcc denotes a power supply line for supplying an upper potential whereas GND denotes a lower supply line for supplying a lower potential. A and B denote differential input terminals of the line receiver. X and Y denote differential outputs of the line receiver circuit of FIG. 1.

The first input stage 1 of this embodiment is designed to operate within a lower common mode input voltage range. The second input stage 2 is designed to operate within a higher common mode input voltage range partially overlapping the lower common mode input voltage range. The term "common mode voltage" denotes a voltage component with respect to ground GND which is present on both input terminals A and B.

In the embodiment shown in FIG. 1, the first input stage 1 comprises a current mirror circuit consisting of NMOS transistors N1 and N3. The sources of transistors N1 and N3 are connected with input terminal A. The drain of transistor N1 and the gate of transistor N1 are connected together to constitute a control current input of the current mirror. The gate of transistor N3 and the gate of transistor N1 are connected together. The drain of transistor N3 constitutes a mirror current input. A constant current source CI1 is connected between the upper power supply line Vcc and the drain of transistor N1. A load impedance R1 is connected between Vcc and the drain of transistor N3. The drain of transistor N3 provides an output signal X.

The input stage 1 comprises a further current mirror consisting of the transistors N2 and N4. The sources of transistors N2 and N4 are connected with the input terminal B. The drain and gate of transistor N2 and the gate of transistor N4 are connected together. The drain of transistor N2 constitutes a control current input and is connected to the constant current source CI1. A second load impedance R2 is connected between Vcc and the drain of transistor N4 which is the mirror current input of this current mirror circuit. The drain of transistor N4 provides a second output signal Y.

In the embodiment shown in FIG. 1, the means for detecting an operating condition of said first input stage 1 which depends on a common mode input voltage at the inputs A and B, is embodied by means of transistors N5 and N6. Transistor N5 has its source connected to input terminal A and has its gate connected with the gate of transistor N1. In this way, transistors N1 and N5 constitute a first current mirror circuit, the drain of transistor N5 being a mirror current input. Transistor N6 has its source connected to input terminal B and has its gate connected with the gate of transistor N2. In this way, the transistors N2 and N6 constitute a second current mirror circuit, the drain of transistor N6 being a mirror current input. The drains of transistors N5 and N6 are connected together. The gates of the transistors N1 to N6 are connected together and with the drains of transistors N1 and N2.

In the embodiment of FIG. 1, the means for activating or enabling the second input stage 2 comprises a second constant current source CI2 which is connected between the upper supply line Vcc and the drains of transistors N5 and N6. It furthermore comprises a transistor P1 with a conductivity type opposite to the transistors N1 to N5. Transistor P1 has its source connected with the drains of transistors N5 and N6 and receives at its gate a reference voltage Vr4 which is constant with respect to the upper supply voltage Vcc. In this way P1 acts as a source follower and provides for a constant voltage drop across the constant current source CI2, and accordingly keeps the potential at the drains of transistors N5 and N6 at a defined level.

The means for enabling the second input stage furthermore comprises a transistor N7 the drain of which is connected with the drain of transistor P1 and the source of which is connected with the lower power supply line GND. The drain and the gate of transistor N7 are connected together.

The second input stage 2 of this embodiment is a voltage difference amplifier comprising a transistor N9 having its gate connected to input terminal A, and comprising transistor N10 the gate of which is connected with input terminal B. The sources of transistors N9 and N10 are connected together and with the drain of a transistor N8. The source of transistor N8 is connected with the lower power supply line GND. The gate of transistor N8 is connected with the gate of transistor N7 such that transistors N7 and N8 constitute a current mirror circuit. The drain of transistor N9 is connected with the drain of transistor N4 and with output terminal Y. The drain of transistor N10 is connected with the drain of transistor N3 and with the output terminal X.

In the following, the operation of this circuit will be explained. For this purpose a situation will be considered, that an input signal is applied to terminals A and B with a common mode voltage which begins at a low level where the first input stage 1 is active and which increases to enter a range where the second input stage 2 is active.

For a low common mode level at terminals A and B, the transistors N1 and N2 act as a current divider such that the current I1 provided by the current source CI1 is divided among these transistors depending on the voltage difference across the terminals A and B. Due to N1 and N3 constituting a current mirror, the current I2 will be an image of the current flowing through N1 while the current I3 will be an image of the current flowing through N2. Accordingly, a voltage difference across the input terminals A and B will appear as an output signal across the output terminals X and Y.

Moreover, due to the transistors N1 and N5 constituting a current mirror and transistors N2 and N6 constituting another current mirror, the current I4 will be an image of the current I1 provided by the constant current source CI1. The operating condition of the first input stage which depends on the common mode voltage at the terminals A and B, is the current I1. If the common mode voltage increases, the voltage drop across the constant current source CI1 will correspondingly decrease and will eventually reach a value where the constant current source CI1 can no longer maintain the current I1. This indicates that the input stage 1 reaches the upper limit of its common mode voltage operating range.

The current I5 supplied by the second constant current source CI2, will be split up into the current I4 and into a current (I5–I4) through the transistor P1. Since I4 is an image of I1, the current (I5–I4) will start to increase when the current I1, and accordingly the current I4 begins to decrease.

The current (I5–I4) flowing through transistor N7 will be mirrored into the current I6, fractions of which flow through transistors N9 and N10. With the common mode voltage at the inputs A, B approaching the upper limit of the input stage 1, the current through N7 will start to increase, and so will the current I6, such that the second input stage 2 will be gradually activated while at the same time the first input stage 1 gradually ceases to operate. Accordingly, the activation of the second input stage 2 depends on the operating condition of the first input stage 1, such that the second input stage 2 will take over the function of the first input stage 1 with high precision at the upper limit of the common mode operating range of the first input stage 1.

Preferably, the currents provided by first current source CI1 and the second current source CI2 are equally large. This can be achieved e.g. by means of embodying current sources CI1 and CI2 as a current mirror circuit, I1 being an image of I5. In this case, the sum of the drain current I2 of N3 and the drain current I8 through transistor N10 will be almost entirely independent from the common mode voltage at the input terminals A and B. Mutatis mutandis, the same holds true for the sum of I3 and I7.

Figure 2:
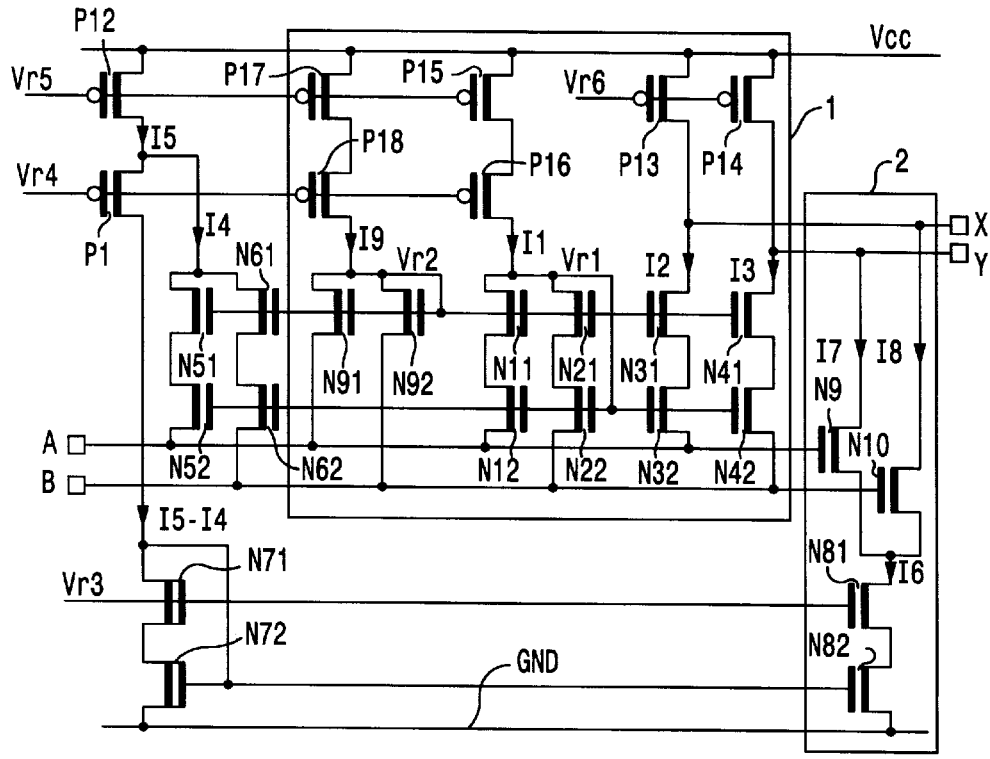
FIG. 2 shows a second embodiment of a line receiver circuit according to the present invention.

FIG. 2 shows a second embodiment of a line receiver circuit according to the present invention. In this embodiment, elements similar to or identical with corresponding elements of the first embodiment of FIG. 1 are denoted with the same reference numerals. Concerning the description of such elements in FIG. 2, reference is made to FIG. 1 in order to avoid repetitions.

In the embodiment shown in FIG. 2, the first input stage 1 comprises a constant current source consisting of transistors P15 and P16 the drain source paths of which are connected in series. In the embodiment of FIG. 2, all current sources and all current mirror circuits of FIG. 1 are embodied as cascode circuits. In general, a cascode circuit comprises a series connection of the drain source paths of two transistors. One of these transistors operates as a source follower in order to keep the drain source voltage of the other transistor at a well defined level. The gate of this other transistor serves as a control input for controlling the current through the series connection of transistors. Cascode circuits of this kind are well known as such.

In the embodiment of FIG. 2, the cascode consisting of transistors N11, N12 and the cascode consisting of transistors N31, N32 constitute a current mirror corresponding to transistors N1 and N3 of FIG. 1.

Similarly, the cascode consisting of transistors N21, N22 and the cascode consisting of transistors N41, N42 of FIG. 2 constitutes a further current mirror corresponding to transistors N2 and N4 of FIG. 1.

The cascode of transistors N51, N52 constitutes a current mirror with the cascode of transistors N11, N12 similar to transistors N5 and N1 in FIG. 1. The cascode of transistors N61, N62 constitutes a current mirror with the cascode of transistors N21, N22, similar to transistors N6 and N2 of FIG. 1.

The embodiment of FIG. 2 comprises transistors N91 and N92 connected to generate a reference voltage Vr2 for the source followers N11, N21, N31, N41, N51 and N61 in their respective cascodes. The source of transistor N91 is connected with input terminal A while the source of transistor N92 is connected with input terminal B. The drains of transistors N91 and N92 are connected together. The gates of transistors N91 and N92 are connected together and with their drains. If a current I9 is supplied into the transistors N91 and N92, the reference voltage Vr2 will be generated with respect to the common mode voltage at the terminals A and B. The current I9 is generated by a constant current source consisting of PMOS transistors P17 and P18. The source of transistor P17 is connected with Vcc. The drain of transistor P17 is connected with the source of transistor P18. The drain of transistor P18 is connected with drains and gates of transistors N91 and N92.

P12 denotes a PMOS transistor the function of which corresponds to the constant current source CI2 of FIG. 1. This transistor has its source connected to Vcc and its drain connected to the source of transistor P1. The gates of the transistors P12, P15 and P17 receive a reference potential Vr5 relative to Vcc. The gates of the transistors P1, P16 and P18 receive a reference potential Vr4 relative to Vcc which is below the potential Vr5.

The cascode of transistor N71 and N72 and the cascode of transistors N81 and N82 constitute a current mirror circuit corresponding to the transistors N7 and N8 of FIG. 1. The gates of the transistors N71 and N81 receive the same reference potential Vr3 relative to the lower supply line GND.

The PMOS transistors P13 and P14 of FIG. 2 embody the load impedances R1 and R2, respectively, of FIG. 1. The source of transistors P13 and P14 is connected with Vcc. The drain of transistor P13 is connected with the drain of N31 and with the drain of N10 and provides an output signal X. The drain of transistor P14 is connected with the drain of transistor N41 and the drain of transistor N9 and provides an output signal Y. The reference potential Vr6 applied to the gates of P13 and P14 is kept constant relative to Vcc and determines the load impedance that is provided by the transistors P13 and P14.

The gates of the transistors N51, N61, N11, N21, N31 and N41 acting as source followers in their respective cascodes, are all connected with the drains of transistors N91 and N92 to receive the reference voltage Vr2. The gates of the transistors N52, N62, N12, N22, N32 and N42 acting as the current control transistors in their respective cascodes, are all connected with the drains of transistors N11 and N21 to receive the reference voltage Vr1.

The embodiments of FIGS. 1 and 2 adopt MOSFET transistors for implementing a line receiver circuit according to the present invention. Of course, a similar design Leitungsempfängerschaltkreis with bipolar transistors or with a mix of bipolar and CMOS transistors is equally feasible. In the above embodiments the first and the second input stage use NMOS FETs. A similar design results from replacing NMOS FETs by PMOS FETs and vice versa.

What is claimed is:

1. A line receiver circuit for receiving differential digital signals from a symmetrical transmission line, having a pair of differential input terminals for connection with said transmission line and having an output for outputting data signals corresponding to signals received via said transmission line, said line receiver circuit comprising:

a first differential input stage having a first pair of differential inputs connected to receive input signals from said pair of differential input terminals;

said first input stage being adapted to receive and process differential signals having a common mode voltage within a first lower common mode voltage range;

a second differential input stage having a second pair of differential inputs connected to receive input signals from said pair of differential input terminals;

said second input stage being adapted to receive and process differential signals having a common mode voltage within a second higher common mode voltage range wherein the second higher common mode voltage range is at least partially greater or higher than the first lower common mode voltage range of the first input stage;

means for combining output signals provided by said first differential input stage and output signals provided by said second differential input stage;

means for detecting an operating condition of said first input stage which operating condition depends on a common mode input voltage at said inputs of said first input stage, wherein the detected operating condition indicates when the first input stage reaches an upper limit of the first lower common mode voltage range; and means for enabling said second input stage depending on said detected operating condition of said first input stage so that the second input stage is enabled when said means for detecting detects that the common mode input voltage reaches the upper limit of the first lower common mode voltage range of the first input stage, so that operation of the second input stage for the second higher common mode voltage is inhibited until the upper limit of the first input stage for the lower common mode voltage range has been reached.

2. A line receiver circuit according to claim 1, further comprising:

a first current source circuit;

said detected operating condition being the amount of an operating current supplied by said first current source circuit into said first input stage.

3. A line receiver circuit according to claim 2, wherein said means for detecting said operating condition of said first input stage comprises a current mirror circuit for providing a mirror current of the current actually supplied by said first current source circuit into said first input stage.

4. A line receiver circuit according to claim 3, wherein said current mirror circuit comprises
- a first current mirror circuit associated with a first one of said input terminals of said line receiver circuit and having a control current input and a mirror current input;
- a second current mirror circuit associated with the other one of said input terminals (A, B) of said line receiver circuit and having a control current input and a mirror current input;
- said control current input of said first current mirror circuit and said control current input of said second current mirror circuit being connected to divide a current supplied by said first current source circuit; and
- said first and said second current mirror circuits being connected with the input terminals such that a ratio between said control current flowing into said first current mirror circuit and said control current flowing into said second current mirror circuit depends on a potential difference across said input terminals.

5. A line receiver circuit according to claim 4, wherein
- said mirror current inputs of said first and second current mirror circuits (N1, N5; N2, N6) are connected together to provide a first mirror current (I4); and
- means (CI2, N7, N8, P1) for enabling or disabling the second differential input stage (N9, N10) adapted to enable said second input stage depending on said first mirror current (I4).

6. A line receiver circuit according to claim 4 further comprising
- a second current source circuit (CI2) for providing a second current (I5);
- said second current source circuit (CI2) being connected to feed said mirror current inputs of said first and second current mirror circuits (N1, N5; N2, N6);
- a shunt circuit (P1, N7) for taking a shunt current (I5-I4) supplied by said second current source circuit (CI2) and not taken by said mirror current inputs;
- means (CI2, N7, N8, P1) for enabling or disabling the second differential input stage (N9, N10) being adapted to enable said second input stage depending on said shunt current (I5-I4).

7. A line receiver circuit according to claim 1 wherein the second input stage comprises
- a difference amplifier comprising a first transistor (N9) connected to receive at its gate a signal from said first input terminal (A), and a second transistor (N10) connected to receive at its gate a signal from said second input terminal (B).

8. A line receiver circuit according to claim 7, wherein said means for enabling said second input stage comprises
- a third current mirror circuit (N7, N8) connected to receive at its control current input said shunt current (I5-I4);
- said first and second transistors (N9, N10) of said difference amplifier circuit being connected to the mirror current input of said third current mirror.

9. A line receiver circuit according to claim 8, comprising means (P1) for keeping a voltage at the output of said second current source at a predetermined potential.

10. The line receiver circuit according to claim 1, wherein said current mirror circuits are of a cascode type.

11. A line receiver circuit for receiving differential digital signals from a symmetrical transmission line, having a pair of differential input terminals for connection with said transmission line and having an output for outputting data signals corresponding to signals received via said transmission line, said line receiver circuit comprising:
- a first differential input stage having a first pair of differential inputs connected to receive input signals from said pair of differential input terminals;
- said first input stage being adapted to receive and process differential signals having a common mode voltage within a first lower common mode voltage range;
- a second differential input stage having a second pair of differential inputs connected to receive input signals from said pair of differential input terminals;
- said second input stage being adapted to receive and process differential signals having a common mode voltage within a second higher common mode voltage range, wherein the second higher common mode voltage range is at least partially greater or higher than the first lower common mode voltage range of the first input stage;
- a circuit for combining output signals provided by said first differential input stage and output signals provided by said second differential input stage;
- a circuit for detecting an operating condition of said first input stage which operating condition depends on a common mode input voltage at said inputs of said first input stage, wherein the detected operating condition indicates when the first input stage reaches an upper limit of the first lower common mode voltage range; and
- a circuit for selectively activating said second input stage depending on said detected operating condition of said first input stage so that the second input stage is active when said circuit for detecting detects that the common mode input voltage reaches the upper limit of the first lower common mode voltage range of the first input stage, so that operation of the second input stage for the second higher common mode voltage is inhibited until the upper limit of the first input stage for the lower common mode voltage range has been reached.

12. A method of operating a line receiver circuit for receiving differential digital signals from a symmetrical transmission line, the line receiver circuit having a pair of differential input terminals for connection with said transmission line and having an output for outputting data signals corresponding to signals received via said transmission line, said method comprising:
- providing the line receiver circuit with a first differential input stage having a first pair of differential inputs connected to receive input signals from said pair of differential input terminals, and a second differential input stage having a second pair of differential inputs connected to receive input signals from said pair of differential input terminals;
- the first input stage receiving and processing differential signals having a common mode voltage within a first lower common mode voltage range;
- the second input stage receiving and processing differential signals having a common mode voltage within a second higher common mode voltage range, wherein the second higher common mode voltage range is at least partially greater or higher than the first lower common mode voltage range;

combining output signals provided by said first differential input stage and output signals provided by said second differential input stage;

detecting an operating condition of said first input stage which operating condition depends on a common mode input voltage at said inputs of said first input stage, wherein the detected operating condition indicates when the first input stage reaches an upper limit of the first lower common mode voltage range; and selectively activating the second input stage depending on said detected operating condition of said first input stage so that the second input stage is active when it is detected that the common mode input voltage reaches the upper limit of the first lower common mode voltage range of the first input stage, so that operation of the second input stage for the second higher common mode voltage is inhibited until the upper limit of the first input stage for the lower common mode voltage range has been reached.

* * * * *